(12) United States Patent
Ohno et al.

(10) Patent No.: US 6,428,644 B1
(45) Date of Patent: Aug. 6, 2002

(54) PROCESS AND APPARATUS FOR PRODUCING A LAMINATE FOR ELECTRONIC PARTS

(75) Inventors: Takao Ohno; Nobuaki Kido; Tsutomu Nakamura; Michio Yoshino; Masatoshi Ozono; Jiro Sadanobu, all of Iwakuni (JP)

(73) Assignee: Teijin Limited, Tokyo (JP)

( * ) Notice: Subject to any disclaimer, the term of this patent is extended or adjusted under 35 U.S.C. 154(b) by 0 days.

(21) Appl. No.: 09/403,169

(22) PCT Filed: Feb. 18, 1999

(86) PCT No.: PCT/JP99/00708

§ 371 (c)(1),
(2), (4) Date: Oct. 18, 1999

(87) PCT Pub. No.: WO99/43012

PCT Pub. Date: Aug. 26, 1999

(30) Foreign Application Priority Data

Feb. 19, 1998 (JP) .............................. 10-037099
Aug. 10, 1998 (JP) .......................... 10-225910
Aug. 31, 1998 (JP) .......................... 10-245227

(51) Int. Cl.7 ......................... B32B 31/18; B32B 31/26; B32B 35/00; H01G 4/30
(52) U.S. Cl. ............................... 156/89.12; 156/89.14; 156/89.16; 156/193; 156/235; 156/250; 156/446; 156/459; 29/25.42
(58) Field of Search ......................... 156/89.12, 89.14, 156/89.16, 184, 185, 187, 446, 459, 230, 234, 235, 193, 250; 29/25.42

(56) References Cited

U.S. PATENT DOCUMENTS 4,475,967 A * 10/1984 Kanai et al.
4,749,421 A * 6/1988 Matsui et al.
4,985,103 A * 1/1991 Kouno et al.
5,019,200 A * 5/1991 Kawabata et al.
5,268,415 A * 12/1993 Pieterse et al.

FOREIGN PATENT DOCUMENTS

| JP | 55-85016 | * | 6/1980 |
| JP | 57-117229 | * | 7/1982 |
| JP | 59-113612 | * | 6/1984 |
| JP | 62-204513 | * | 9/1987 |
| JP | 62-283622 | * | 12/1987 |
| JP | 3-108307 | | 5/1991 |
| JP | 9-129483 | | 5/1997 |
| JP | 9-183111 | * | 7/1997 |
| WO | WO 91/01346 | | 2/1991 |

OTHER PUBLICATIONS

International Search Report.

* cited by examiner

Primary Examiner—Curtis Mayes
(74) Attorney, Agent, or Firm—Sughrue Mion, PLLC

(57) ABSTRACT

An apparatus and a process for producing a laminate for electronic parts such as ceramic capacitors. After a predetermined pattern for forming an internal conductive layer is formed on a self-supporting green sheet which contains inorganic powder and an organic binder, the self-supporting green sheet is taken up by a columnar roll and laminated. At this point, the position of the same pattern on the green sheet G2 of the next cycle to be laminated adjacently onto the green sheet G1 of the previous cycle as the above pattern with respect to the predetermined pattern on the green sheet G1 taken up by the columnar roll is determined.

37 Claims, 3 Drawing Sheets

PROCESS AND APPARATUS FOR PRODUCING A LAMINATE FOR ELECTRONIC PARTS

FIELD OF THE INVENTION

The present invention relates to a process and an apparatus for producing a laminate for electronic parts such as ceramic capacitors. More specifically, it relates to a process and an apparatus capable of producing a multi-layer laminate for electronic parts with a high output on an industrial scale.

PRIOR ART

In recent years, in the field of electronic parts, along with a tendency toward high-density surface mounting, it has been desired to reduce the sizes of laminate electronic parts such as laminate ceramic capacitors, laminate varistors, laminate filters and laminate piezoelectric elements and to improve the functions of these laminate electronic parts. A laminate ceramic capacitor is taken as an example hereinafter.

A laminate ceramic capacitor comprises a plurality of dielectric ceramic layers, a plurality of internal electrodes formed between respective adjacent ceramic layers and external electrodes connected to the respective internal electrodes at the ends of the dielectric ceramic layers.

Heretofore, the laminate ceramic capacitor has been produced by the following process.

A ceramic green sheet is prepared by casting a ceramic slurry over a stainless steel belt or the like into a sheet-form by a doctor blade method, and a conductive paste containing a metal which will become internal electrodes, such as palladium, silver-palladium or nickel, is coated on the ceramic green sheet surface to form predetermined electrode patterns by such a method as screen printing or the like. Generally, a plurality of laminate ceramic capacitors are produced by first forming a plurality of electrode patterns on a single green sheet, then laminating the second green sheet thereon, press-bonding the laminate in a thickness direction by a press to form the same patterns as above on the second green sheet, successively repeating the lamination and patterns-formation of the third and subsequent green sheets similarly to the second green sheet to obtain a final laminate and cutting the obtained laminate in the succeeding step. A wet or dry isotactic press is used as a press.

The obtained press-bonded laminate is cut so as to give laminates for obtaining individual laminate ceramic capacitors, the binder is removed from each laminate obtained by cutting, and the laminate is baked to obtain a sintered product. Thereafter, the external electrodes connected to the internal electrodes are baked to produce a laminate ceramic capacitor.

It has recently been desired to reduce the thickness of a ceramic laminate and increase the number of layers of the laminate so as to obtain a small-size and large-capacity laminate electronic part.

However, in an apparatus for producing a laminate electronic part by laminating together a plurality of ceramic green sheets as described above, an increase in the number of ceramic green sheets for a reduction in the thickness and an increase in the number of layers of a ceramic laminate requires a lot of time for the production of a single laminate.

Consequently, it has been desired to develop a laminate production apparatus which can improve productivity and differs from the apparatus for producing a laminate electronic part by cutting a ceramic green sheet to a predetermined shape and laminating a plurality of the ceramic green sheets as described above.

JP-A 4-500835 (the term "JP-A" as used herein means an "unexamined published Japanese patent application") discloses a thin self-supporting unprocessed compressed material which contains an inorganic substance and a binder and has a thickness of less than 25μm, wherein the binder as a thin layer material is a polymer having a weight average molecular weight of 400,000 or more, the polymer forms a thermally reversible gelation system having a gelation point and a melting point higher than room temperature in an appropriate solvent, and the volume fraction of the inorganic substance is 45% or more based on the total amount of the binder and the inorganic substance. This publication discloses a multi-layer magnetic capacitor as an example of this unprocessed compressed material but does not teach a process and an apparatus for producing the same.

SUMMARY OF THE INVENTION

It is an object of the present invention to provide an apparatus for producing a laminate for electronic parts such as ceramic capacitors using a self-supporting green sheet containing inorganic powder and an organic binder.

It is another object of the present invention to provide an apparatus capable of producing a multi-layer laminate for electronic parts using a self-supporting green sheet containing inorganic powder and an organic binder with a high output on an industrial scale.

It is still another object of the present invention to provide a process for producing a laminate for electronic parts such as a ceramic capacitor, particularly a multi-layer laminate, industrially advantageous.

Other objects and advantages of the present invention will become apparent from the following description.

According to the present invention, firstly, the above objects and advantages of the present invention are attained by an apparatus for producing a laminate for electronic parts (may be referred to as "first production apparatus of the present invention" hereinafter) which comprises:

(1) a feed unit for unrolling a self-supporting green sheet which contains inorganic powder and an organic binder;
(2) a columnar roll for taking up and laminating the self-supporting green sheet;
(3) a fixing unit for fixing the layers of the green sheet taken up by the columnar roll so that they do not shift out of alignment from one another;
(4) a pattern forming unit for forming an internal conductive layer having a predetermined pattern on the green sheet taken up by the columnar roll; and
(5) a pattern positioning unit for positioning the same pattern on the green sheet G2 of the next cycle to be laminated adjacently onto the green sheet G1 as a predetermined pattern on the green sheet G1 of the previous cycle taken up by the columnar roll with respect to the predetermined pattern on the green sheet G1.

Secondly, the above objects and advantages of the present invention are attained by an apparatus for producing a laminate for ceramic capacitors (to be referred to as "second production apparatus of the present invention" hereinafter) which comprises:

(1) a feed unit for unrolling a self-supporting green sheet which contains ceramic powder and an organic binder;
(2) a columnar roll for taking up and laminating the self-supporting green sheet;
(3) a fixing unit for fixing the layers of the green sheet taken up by the columnar roll so that they do not shift out of alignment from one another;

(4) a press-bonding unit for close-bonding together the layers of the green sheet taken up by the columnar roll;

(5) a pattern forming unit for forming an internal conductive layer having a predetermined pattern on the green sheet taken up by the columnar roll; and (6) a pattern positioning unit for positioning the same pattern on the green sheet G2 of the next cycle to be laminated adjacently onto the green sheet G1 as a predetermined pattern on the green sheet G1 of the previous cycle taken up by the columnar roll with respect to the predetermined pattern on the green sheet G1.

Thirdly, the above objects and advantages of the present invention are attained by an apparatus for producing a laminate for electronic parts (may be referred to as "third production apparatus of the present invention" hereinafter) which comprises:

(1) a feed unit for unrolling a self-supporting green sheet which contains inorganic powder and an organic binder;

(2) a columnar roll for taking up and laminating the self-supporting green sheet;

(3) a fixing unit for fixing the layers of the green sheet taken up by the columnar roll so that they do not shift out of alignment from one another; and (4) a pattern positioning unit for positioning the same pattern on the green sheet G2 of the next cycle to be laminated adjacently onto the green sheet G1 as a predetermined pattern on the green sheet G1 of the previous cycle taken up by the columnar roll with respect to the predetermined pattern on the green sheet G1.

Fourthly, the above objects and advantages of the present invention are attained by a process for producing a laminate for electronic parts by winding a self-supporting green sheet which contains inorganic powder and an organic binder and has a predetermined pattern for forming an internal conductive layer formed thereon round a columnar roll several times (may be referred to as "first production process of the present invention" hereinafter), wherein the green sheet G2 of the next cycle is wound round the green sheet G1 of the previous cycle to ensure that a fixed positional relationship is established between a predetermined pattern formed on the green sheet G1 wound round the columnar roll and the same pattern formed on the green sheet G2 as the predetermined pattern on the green sheet G1.

Fifthly, the above objects and advantages of the present invention are attained by a process for producing a laminate for electronic parts by winding a self-supporting green sheet which contains inorganic powder and an organic binder and has a predetermined pattern for forming an inner conductive layer formed thereon round a columnar roll several times (may be referred to as "second production process of the present invention" hereinafter), wherein either one or both of the following steps is/are carried out in the order named after the step of winding the green sheet G2 of the next cycle round the green sheet G1 of the previous cycle to ensure that a fixed positional relationship is established between a predetermined pattern formed on the green sheet G1 wound round the columnar roll and the same pattern formed on the green sheet G2 of the next cycle as the predetermined pattern on the green sheet G1;

the step of thermally relaxing the obtained laminate wound round the columnar roll to control shrinkage in the lamination plane at 200° C. to 1% or less; and the step of hydrostatically pressing the laminate wound round the columnar roll.

Finally, the above objects and advantages of the present invention are attained by a process for producing a ceramic capacitor from a laminate formed by winding a self-supporting green sheet which contains ceramic powder and ultra high molecular weight polyethylene round a columnar roll several times (may be referred to as "third production process of the present invention" hereinafter), wherein the green sheet G2 of the next cycle is wound round the green sheet G1 of the previous cycle to ensure that a fixed positional relationship is established between a predetermined pattern formed on the green sheet G1 wound round the columnar roll and the same pattern formed on the green sheet G2 of the next cycle as the predetermined pattern on the green sheet G1; the predetermined pattern is formed on the green sheet G1 before the self-supporting green sheet G2 of the next cycle is wound round the self-supporting green sheet G1 having no predetermined pattern for forming an internal conductive layer; the predetermined pattern consists of a single row or a plurality of rows of quadrilaterals arranged linearly at intervals, each of which is shorter than the length of one side parallel to the arrangement direction of the quadrilateral; and the green sheet G2 is wound round the green sheet G1 by locating each of the quadrilaterals of the green sheet G2 over the interval between the adjacent quadrilaterals of the green sheet G1 to establish the above fixed positional relationship between the predetermined patterns of the adjacent green sheets G1 and G2.

The above production apparatuses and processes of the present invention will be described hereinunder.

BRIEF DESCRIPTION OF THE ACCOMPANYING DRAWINGS

DETAILED DESCRIPTION OF THE INVENTION

First Production Apparatus

Figure 1:
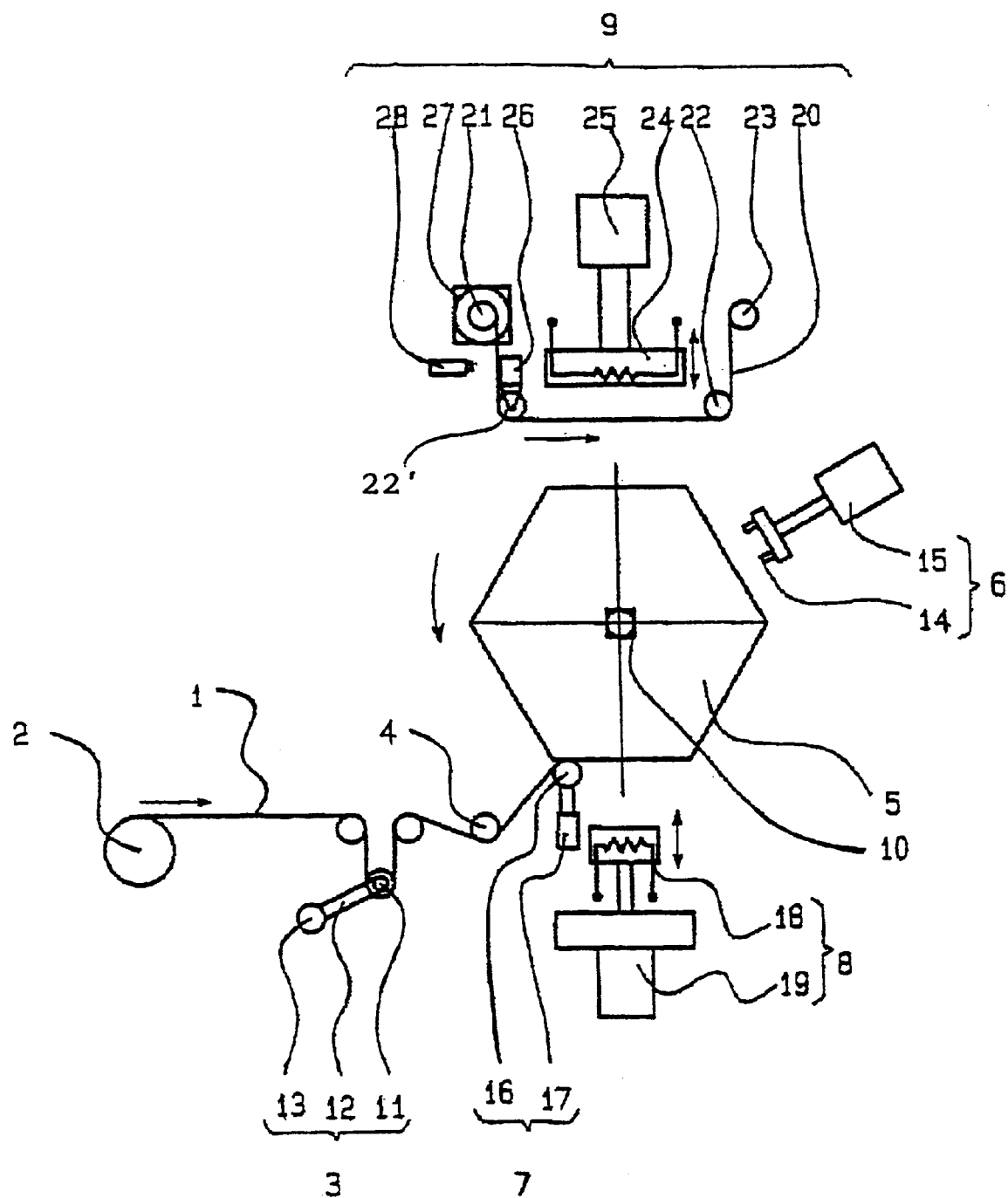
FIG. 1 is a diagram for explaining the whole constitution of a production apparatus according to an embodiment of the present invention.

The feed unit for unrolling a self-supporting green sheet (1) is composed of a feed shaft for unrolling a green sheet. A brake, clutch or drive motor may be attached to the feed shaft as required. The drive motor may be a servo motor, DC motor, induction motor or the like.

The green sheet in the present invention is preferably self-supporting so that it can be handled by itself without a base such as a carrier tape, and is soft, flexible and elastic. The green sheet is preferably an oriented sheet whose molecules are oriented by uniaxial or biaxial stretching and which shrinks at least 1% by heating in a stretching direction.

The self-supporting green sheet contains inorganic powder and an organic binder.

Illustrative examples of the inorganic powder forming the self-supporting green sheet include inorganic material powder that can be sintered, such as metal and ceramic powder and fillers. For example, gold, silver, copper, nickel or zinc may be used as the metal and an oxide ceramic comprising titanium, aluminum, barium, lead, zirconium, silicon or yttrium may be used as the ceramic. The inorganic powder preferably have an average particle diameter of 0.1 to 10 $\mu$m.

The organic binder is selected from polymer materials such as polyolefins, acrylic resins, cellulose derivatives, polyester resins, polyamide resins and urethane resins. Of these polymer materials, polyolefins as disclosed by JP-A 4-500835 are preferred as will be described hereinafter.

Ultra high molecular weight polyolefins having a weight average molecular weight of 400,000 or more are more preferred. When the weight average molecular weight is less than 400,000, the organic binder flows at the time of melting, whereby deformation occurs. It is difficult to obtain a polymer having a preferred molecular weight from the organic binder other than polyolefins. At least one polyolefin is selected from polyethylene, polyvinyl alcohols and copolymers thereof, and preferably has a molecular weight of 400,000 or more, more preferably 1,000,000 or more. For example, polyethylene having an ultra high molecular weight is so called UHMWPE.

The self-supporting green sheet preferably has a porosity of 1 to 80% by volume. The porosity is preferably 10 to 70% by volume, more preferably 60 to 70% by volume. Pores are formed at the time of producing a green sheet by a wet or dry molding process. An example of a porous green sheet is a film disclosed by JP-A 4-500835.

The self-supporting green sheet preferably contains 50 to 95 wt % of an inorganic component and 5 to 50 wt % of an organic binder component. A green sheet having a larger content of an inorganic component is more preferred. When the content of the organic binder component is too small, however, the strengths of the resulting laminate and molded product are liable to be insufficient. More preferably, the content of the inorganic component is 60 to 94 wt % and the content of the organic binder component is 6 to 40 wt %. Particularly preferably, the content of the inorganic component is 70 to 93 wt % and that of the organic binder component is 7 to 30 wt %.

The thickness of the self-supporting green sheet is not particularly limited, but is preferably 1 to 100 $\mu$m.

The columnar roll (2) for taking up and laminating the self-supporting green sheet has a drive source for rotating the columnar roll intermittently. As the drive source may be used a servo motor, stepping motor, DC motor, inductor motor or a combination of either one of the above motors and a mechanical indexing machine such as a cam mechanism or a Geneva mechanism.

The columnar roll (2) may be a column having a smooth and curved peripheral surface, polygonal column or plate.

The column having a smooth and curved peripheral surface may be a column having a circular or oval section in a direction perpendicular to the lengthwise direction of the column, as exemplified by a circular cylinder. The polygonal column is a column having a triangular, tetragonal or pentagonal section in a direction perpendicular to the lengthwise direction of the column, as exemplified by a tetragonal cylinder. Each face of the polygonal column may be slightly curved.

The plate has substantially two faces for taking up the self-supporting green sheet and each face may be curved.

Sheet guide rollers may be provided between the feed unit (1) and the columnar roll (2) to carry the green sheet from the feed (1) to the columnar roll (2), change the direction of the green sheet as the case may be, and prevent the horizontal shift of the green sheet. The sheet guide rollers may have any structure if they prevent slippage between each of the rollers and the green sheet and may be rotated by a motor or the traveling of the green sheet itself. The sheet guide rollers may be made from a metal or resin.

The fixing unit (3) for fixing each layer so that the layers of the green sheet taken up by the columnar roll do not shift out of alignment from one another is, for example, a device for bonding with an adhesive or a thermal fusion device. For example, the thermal fusion device may comprise a heater controller and a heater whose temperature is controlled to a predetermined temperature by the heater controller. The area to be fixed by the fixing unit (3) must be larger than the area of the internal conductive layer formed by the pattern forming unit (4) which will be described hereinafter. The heater used to bond by heating is a heater having a pointed, plate-like or rectangular end for allowing the green sheet to be bonded by heat in a contact or non-contact state.

The fixing unit (3) comprises a drive for moving the fixing unit (3) to a predetermined location in an approaching direction toward the green sheet, in the width direction of the green sheet and/or the longitudinal direction of the green sheet, such as a linearly moving unit. The linearly moving unit can be implemented by a linearly moving system using a pneumatic unit, a hydraulic unit or a set of a ball screw and a motor.

A press-bonding unit may be provided at an upstream side of the pattern forming unit to closely bond a layer of the green sheet to another layer of the green sheet on the columnar roll. For example, a nipping device or press can be used as the press-bonding unit. The nipping device can closely bond together the layers of the green sheet on the columnar roll under fixed tension without producing a wrinkle. The nipping device comprises, for example, a free roller which freely ratates and a linearly moving unit for moving the free roller to a predetermined location. The linearly moving unit can be implemented by a linearly moving system using a pneumatic cylinder, a hydraulic cylinder or a set of a ball screw and a motor.

The press is preferably used to closely bond the layers of the green sheet on the columnar roll, compresses them in a lamination direction and facilitate the formation of a pattern which will be carried out in the subsequent step. For example, a press having a flat surface or convex surface which is large enough to cover the entire pattern to be formed in the subsequent step may be used. When the green sheet is pressed, it may be heated at a temperature range at which the green sheet does not shrink or deform.

The pattern forming unit (4) forms an internal conductive layer having a predetermined pattern by such means as printing. The pattern is formed by a method in which a transfer film having an internal conductive layer formed thereon is contacted and pressed to a green sheet at room temperature or in a heat atmosphere to form the internal conductive layer, a printing method such as screen printing or gravure printing, or a thin film forming method such as deposition or sputtering. The pattern forming unit can be installed at any location above the peripheral surface of the columnar roll but is preferably installed above the columnar roll in such a manner that it is parallel to the axis of the columnar roll to prevent the adhesion of dust. At the pattern forming unit using the transfer film, a pattern forming unit comprises a transfer film, a feed unit having a feed shaft for unrolling a transfer film, guide rollers for carrying the transfer film to a transfer head, changing the direction of the transfer film and preventing the horizontal shift of the transfer film, a take-up unit having a take-up shaft for taking up the base film of the transfer film after a pattern is transferred onto the green sheet by a thermal transfer head, a transfer head drive unit which is driven by a pneumatic cylinder, a hydraulic cylinder or a set of a ball screw and a motor, a transfer head, installed at the end of the ram of the transfer head drive, for transferring the pattern by closely bonding and pressing the transfer film to the green sheet at room temperature or by heating, a tension detector for detecting the tension of the transfer film between the feed unit and the take-up unit by a system for directly measuring the tension of the transfer film such as a load cell system or a dancer roll system, and a tension controller for controlling the tension of the transfer film by means of a brake, drive motor or drive motor with clutch, based on the detected tension data. The guide rollers may have any structure and be made from any material if it does not cause slippage between each of the guide rollers and the transfer film, and may be rotated by a motor or the traveling of the transfer film.

Since the above transfer head makes close-bonding of the transfer film to the green sheet by pressure, it can be also used to carry out the pressing step of the above press-bonding unit.

The transfer film consists of a base film of a polyester, polyolefin or the like and a pattern to be transferred formed on the base film. A release agent made from silicon or the like is preferably coated on the base film on which the pattern is to be formed. The pattern can be formed by a conventionally known method such as printing exemplified by a screen printing or gravure printing or a thin film formation method exemplified by deposition or sputtering.

The pattern positioning unit (5) positions the same pattern as a predetermined pattern formed on the green sheet G1 of the previous cycle on the green sheet G2 of the next cycle to be laminated adjacently onto the green sheet G1 with respect to the predetermined pattern on the green sheet G1 taken up by the columnar roll.

The pattern positioning unit (5) comprises as main components a position control unit for determining the position of the above pattern forming unit relative to the pattern forming portion on the peripheral surface of the columnar roll and a positioning unit for detecting the position of the transfer film by means of a pattern recognition or image processing visual recognition system and determining the position of the transfer film. The position control unit and the positioning unit are integrated with each other so that they can exchange information. The position control unit comprises a specific shape unit provided at a specific position of the columnar roll and positioning pins provided at a position opposed to the specific position on the peripheral surface of the columnar roll and having a shape to be mated with the specific shape unit. A drive for moving the positioning pins to the columnar roll is composed of a pneumatic or hydraulic unit or a set of a motor and a ball screw.

The positioning unit for detecting the position of the transfer film determines the position of the transfer film for forming a predetermine pattern at a predetermined position of the green sheet after the position of the green sheet on the peripheral surface of the columnar roll is determined by the position control unit.

Pattern positioning is carried out as follows, for example. To take up the green sheet and form a pattern, the columnar roll is first turned and stopped at a predetermined angle and then the positioning pins having a specific shape in the position control unit is moved to the columnar roll and mated with the specific shape unit provided at a specific position of the columnar roll to determine the position of the pattern forming portion on the peripheral surface of the columnar roll. Thereafter, the positioning unit determines the position of the transfer film to complete the final pattern positioning.

The positional relationship between the patterns of the adjacent green sheets G1 and G2 positioned by the pattern positioning unit (5) is, for example, such that the predetermined pattern formed on the green sheet G1 consists of a plurality of quadrilaterals arranged linearly at intervals, each of which is shorter than the length of one side parallel to the arrangement direction of the quadrilateral, and that the same pattern on the green sheet G2 is shifted from the pattern on the green sheet G1 to cover the interval between the adjacent quadrilaterals of the pattern on the green sheet G1 when the same pattern as the pattern on the green sheet G1, that is, the quadrilaterals of the same shape are formed on the green sheet G2 in the same configuration. In this case, the quadrilaterals of the predetermined patterns on the green sheets G1 and G2 may be disposed in a single row or a plurality of rows, for example, 2 to 1,000 rows, preferably 10 to 1,000 rows.

Stated more specifically, the center of a quadrilateral on the green sheet G2 is located at the center of the interval between two adjacent quadrilaterals arranged in a longitudinal direction of the green sheet G1.

The sheet tension detector for detecting the tension of the green sheet may be provided between the feed unit (1) and the columnar roll (2). The sheet tension detector is composed of a tension detector of a dancer roll system or a load cell system for directly measuring the tension of the green sheet.

The tension controller for controlling the tension of the green sheet which is composed of a set of a brake and a drive motor or a set of a drive motor and a clutch is provided at a specific position between the feed unit (1) and the columnar roller (2) to control the tension of the green sheet based on the detected tension data of the green sheet. The drive motor may be a servo motor, DC motor, induction motor or the like.

Second Production Apparatus

The second production apparatus is an apparatus for producing a laminate for ceramic capacitors. The second production apparatus comprises a press-bonding unit for closely bonding layers of the green sheet taken up by the columnar roll as an essential element. The press-bonding unit is an optional element in the first production apparatus. A ceramic capacitor is required to be multi-layered and close-bonding between layers is very important in this case. A multi-layered ceramic capacitor consists of 50 to 1,000 layers, preferably 100 to 1,000 layers.

As for what is omitted for the second production apparatus, it should be understood that what has been described of the first production apparatus can be applied.

Third Production Apparatus

The third production apparatus has no pattern forming unit for forming an internal conductive layer having a predetermined pattern on the green sheet taken up by the columnar roll, which is a constituent element in the first production apparatus. Therefore, a self-supporting green sheet containing inorganic powders and an organic binder and having a predetermined pattern for forming an internal conductive layer formed thereon is used at the feed unit for unrolling the self-supporting green sheet. The pattern forming unit for forming a pattern on the green sheet may be provided between the feed unit and the columnar roll. According to this method, the pattern forming unit does not need to be installed for the columnar roll.

To prepare the self-supporting green sheet having a predetermined pattern, a method for contacting and press-bonding a transfer film having an internal conductive layer formed thereon to the green sheet at room temperature or in a heat atmosphere, a printing method such as screen printing or gravure printing, or a film forming method such as deposition or sputtering can be employed.

In this apparatus, it is necessary to determine the positional relationship between the patterns of the adjacent green sheets while the columnar roll is rotated to wind the green sheet. Therefore, the position of the green sheet wound round the columnar roll is monitored.

The pattern positioning unit comprises an image detection camera, an image processing controller and a columnar roll drive motor 8 for positioning the predetermined pattern formed on the green sheet by rotating the columnar roll.

Pattern positioning is carried out as follows. The columnar roll is rotated by the columnar roll drive motor 8 until the predetermined pattern consisting of quadrilaterals arranged in a longitudinal direction of the green sheet at predetermined intervals and a detection mark come to the detection position of the image detection camera. When the detection mark is detected by the image detection camera and the image processing controller, the columnar roll drive motor stops operation to stop the columnar roll. When the detection mark is off a predetermined position, the columnar roll is rotated in an either direction by the columnar roll drive motor to stretch or loosen the green sheet so as to position the predetermined pattern formed on the green sheet.

After the positioning of the predetermined patter formed on the green sheet, the layers of the green sheet are closely bonded together by the press-bonding unit and fixed by close-bonding by the sheet bonding unit so that they do not shift out of alignment from one another.

In the case of the third production apparatus, the green sheet G1 having a predetermined pattern and the green sheet G2 having the same predetermined pattern as the above can be different green sheets and hence, the third production apparatus may have two feed units. The green sheet G2 is superposed onto the green sheet G1 to ensure that their predetermined patterns have a fixed positional relationship, and then, the green sheets are taken up by a columnar roll and laminated. In this lamination, therefore, when the green sheet G1 is laminated onto the green sheet G2, the predetermined patterns on the green sheets G1 and G2 can have a fixed positional relationship between one another.

As for what is omitted for the third production apparatus, it should be understood that what has been described of the first production apparatus can be directly applied.

First Production Process

The first production process of the present invention is a process for producing a laminate for electronic parts by winding a self-supporting green sheet containing inorganic powder and an organic binder and having a predetermined pattern for forming an internal conductive layer thereon round a columnar roll several times. In this respect, the green sheet G2 of the next cycle must be wound round the green sheet G1 of the previous cycle to ensure that a predetermined pattern on the green sheet G1 wound round the columnar roll and a predetermined pattern (the same pattern as that on the green sheet G1) on the green sheet G2 wound round the green sheet G1 should have a fixed positional relationship. According to the process for producing a laminate by winding a self-supporting green sheet having a predetermined pattern formed thereon round the columnar roll several times, it is easy to establish the fixed positional relationship between the patterns on the green sheet of the previous cycle and on the green sheet of the next cycle and a laminate for electronic parts can be easily produced efficiently and industrially advantageously.

To assist the establishment of the fixed positional relationship between the predetermined pattern on the green sheet G1 of the previous cycle and the predetermined pattern on the green sheet G2 of the next cycle wound round the green sheet G1, that is, to produce the laminate of the present invention advantageously while the predetermined patterns on the green sheets G1 and G2 have the fixed positional relationship, the green sheets G1 and G2 having the fixed positional relationship are preferably fixed by heat.

The self-supporting green sheet having a predetermined pattern for forming an internal electrode layer is prepared before the first production process is carried out or when the first production process is carried out. In the latter case, before the green sheet G2 of the next cycle is wound round the columnar roll, a predetermined pattern must be formed on the green sheet G2 of the previous cycle. How to form the predetermined pattern on the self-supporting green sheet has been described in the section of the third production apparatus. How to form the predetermined pattern on the green sheet during production has been described in the section of the first production apparatus.

The fixed positional relationship between the predetermined pattern on the green sheet G1 of the previous cycle and the predetermined pattern on the green sheet G2 of the next cycle is, for example, such that the predetermined pattern formed on the green sheet G1 consists of a plurality of quadrilaterals arranged linearly at intervals, each of which is shorter than the length of one side parallel to the arrangement direction of the quadrilateral, and the same pattern on the green sheet G2 is shifted from the pattern on the green sheet G1 to cover the interval between the adjacent quadrilaterals of the pattern on the green sheet G1 when the same pattern as the pattern on the green sheet G1, that is, the quadrilaterals of the same shape are formed on the green sheet G2 in the same configuration. In this case, the quadrilaterals of the predetermined patterns on the green sheets G1 and G2 may be disposed in a single row or a plurality of rows, for example, 2 to 1,000 rows, preferably 10 to 1,000 rows.

The first production process of the present invention can be carried out using the first to third production apparatuses.

The case where the first production process is carried out using the first production apparatus will be described hereinunder.

The self-supporting sheet containing inorganic powder and an organic binder is supplied from the feed unit (1) to the columnar roll (2), taken up by the columnar roll (2) and laminated. When the self-supporting green sheet is taken up by the columnar roll (2) and laminated, the layers of the green sheet already taken up are fixed by the fixing unit (3) so that the layers do not shift out of alignment from one another. Thereafter, an internal conductive layer having a predetermined pattern is formed on the fixed green sheet by the pattern forming unit (4). At this point, the position where the internal conductive layer having a predetermined pattern is formed on the green sheet is determined by the pattern positioning unit (5) to ensure that the predetermined pattern should have a fixed positional relationship with a predetermined pattern formed on the green sheet G1 which has already been taken up.

The green sheet which is supplied from the feed unit (1) to the columnar roll (2) is preferably pressed by the press-bonding unit to improve its close-bonding to the laminated green sheet which has already been wound round the columnar roll (2).

The first production process of the present invention which uses the second production apparatus and the third production apparatus can be understood from the above description.

Second Production Process

The second production process of the present invention comprises the step of further processing a laminate obtained by the first production process of the present invention.

That is, after the first production process is carried out, either one or both of the step of thermally relaxing the obtained laminate wound round the columnar roll to control shrinkage in the lamination plane at 200° C. to 1% or less and the step of hydrostatically pressing the laminate wound round the columnar roll is/are carried out in the order named.

The above thermal relaxation treatment is generally carried out at a temperature higher than the melting point of the organic binder forming the laminate for several tens of seconds to several minutes. The thermal relaxation treatment is carried out while the laminate is wound round the columnar roll to prevent the in-plane shrinkage of the laminate.

When a uniaxially stretched film comprising ultra high molecular weight polyethylene as an organic binder is used as the green sheet, the green sheet shrinks as the stress of the green sheet is relaxed by heating at that temperature. However, since stress at the time of shrinkage is uniformly applied toward the center direction of the laminate, the roll of the green sheet rarely gets out of alignment by shrinkage. When a green sheet which endures stress at the time of shrinkage is used, a densified laminate can be obtained by shrinkage advantageously. It is advantageous to set the temperature for heating the laminate higher than the melting point of the ultra high molecular weight polyethylene when it is used as an organic binder. When the temperature is not higher than the melting point, the thermal relaxation of the organic binder component is not satisfactory, and the laminate shrinks disadvantageously at the time of removing the organic binder component which will be carried out in the subsequent step of the production of a capacitor. The heating temperature, which depends on processing method somewhat, is preferably in the range of 140 to 170° C. By such heat treatment, the shrinkage in the lamination plane of the green sheet at 200° C. is controlled to 1% or less.

The above hydrostatic pressing is carried out using a hydrostatic press. The pressure is generally 100 to 4,000 kg/cm$^2$. The treatment can be carried out at a temperature from room temperature to a temperature higher than the melting point of the laminate but is preferably carried out at a temperature close to or higher than the melting point, for example, (melting point−80)°C. to (melting point+30)°C. from the view points of the production of a densified laminate and the thermal relaxation of the organic binder component.

By carrying one or both of the above steps in the order named, a fine laminate free from shrinkage by heating in the subsequent step can be obtained. For example, a laminate ceramic capacitor can be obtained by cutting the obtained laminate into chips according to an electrode pattern, heating the chips to remove the binder, baking it and forming external electrodes. At this point, operations such as the formation of chips and the removal of the binder can be carried out smoothly and a high-quality ceramic capacitor can be obtained at a high yield.

Third Production Process

The third production process of the present invention is a process for producing a ceramic capacitor. A predetermined pattern formed on the green sheet consists of a single row or a plurality of rows of quadrilaterals arranged linearly at intervals, each of which is shorter than the length of one side parallel to the arrangement direction of the quadrilateral. By forming this pattern while the layers of the laminate have a fixed positional relationship, a ceramic capacitor can be advantageously produced from the obtained laminate. In this third production process, ultra high molecular weight polyethylene is used as the organic binder and the above fixed positional relationship is the same as in the first production process.

In the third production process, the step of fixing the green sheets G1 and G2 by heat as described in the section of the first production process can be carried out to establish a fixed positional relationship between a predetermined pattern formed on the green sheet G1 and a predetermined pattern formed on the green sheet G2 wound round the green sheet G1.

Before the predetermined pattern is formed on the green sheet G2, pressure can be applied to the green sheets G1 and G2 to closely bond together the green sheets G1 and G2. This close-bonding can be carried out using the press-bonding unit which has been described in the section of the second production apparatus.

In the third production process, one or both of the thermal relaxation step and the hydrostatically pressing step which have been described in the section of the second production process can be carried in the order named.

DETAILED DESCRIPTION OF THE PREFERRED EMBODIMENTS

With reference to the accompanying FIG. 1, the case where the present invention is applied to the production of a laminate for laminate ceramic capacitors will be described.

FIG. 1 is a diagram showing the basic configuration of an apparatus for producing a laminate for laminate ceramic capacitors according to an embodiment of the present invention. In FIG. 1, the apparatus comprises a tension controller (not shown) for controlling the tension of a green sheet 1 based on tension detected by a sheet tension detector 3, a feed unit 2 having a feed shaft for unrolling the green sheet 1, the tension detector 3 for detecting changes in the tension of the green sheet 1 during the traveling of the green sheet 1, sheet guide rollers 4 for guiding the green sheet 1 from the feed unit 2 to a polygonal columnar roll 5, the polygonal columnar roll 5, having a plurality of flat portions formed continuously in a peripheral direction on the peripheral surface, for forming a laminate by taking up the green sheet 1, a position controlling unit 6 for determining the position of a pattern forming unit relative to a flat portion on the peripheral surface of the polygonal columnar roll 5, a green sheet press-bonding (nipping) unit 7 for closely bonding the layers of the wound green sheet, a sheet fixing unit 8 for fixing the wound green sheet 1 by close-bonding so that the layers of the green sheet do not shift out of alignment from one another, the pattern forming unit 9, installed opposite to the flat portion on the peripheral surface of the polygonal columnar roll 5, for forming an internal conductive layer having a predetermined pattern on the green sheet 1, and a polygonal columnar roll drive motor 10 for rotating the polygonal columnar roll 5 in a predetermined direction.

The rolled green sheet 1 is unrolled from the feed unit 2 having the feed shaft with a brake. The sheet tension detector 3 comprises a dancer roll 11 round which the green sheet 1 is passed, a dancer arm 12 for supporting this roll at one end thereof in such a manner that it can swing freely, and an angle sensor 13 for detecting the deflection angle of the dancer arm 12. The apparatus comprises a tension control system (not shown) for detecting a change in the position of the dancer roll 11 and controlling the tension of the green sheet 1 by means of the brake provided on the feed shaft of the feed unit 2 to fix the position of the dancer roll 11.

According to the above constitution, the tension of the green sheet 1 when taken up by the polygonal columnar roll 5 is the total of tensions applied by the weights of the dancer roll 11 and the dancer arm 12 of the sheet tension detector 3. The setting of the tension of the green sheet 1 when it is taken up is carried out by changing the weights of the dancer roll 11 and the dancer arm 12 of the sheet tension detector 3.

The green sheet 1 unrolled from the feed unit 2 is carried by the sheet guide rollers 4 and taken up by the polygonal columnar roll 5.

The position controlling unit 6 is arranged above the peripheral surface of the polygonal columnar roll 5. After the polygonal columnar roll 5 is rotated intermittently by the drive motor 10 and stopped at a predetermined angle, the position controlling unit 6 determines the position of the pattern forming unit 9 relative to the flat portion on the peripheral surface of the polygonal columnar roll 5. A plurality of positioning holes 14 are formed in the flat portions on the peripheral surface of the polygonal columnar roll 5 and a plurality of positioning protrusions are formed on the position controlling unit 6. The position controlling unit 6 is driven by a pneumatic cylinder 15 and the positioning protrusions 14 are fitted into the positioning holes (not shown) formed in the flat portions on the peripheral surface of the polygonal columnar roll 5 for positioning.

The green sheet nipping unit 7 is installed at a position where the green sheet 1 begins to be wound round the flat portions on the peripheral surface of the polygonal columnar roll 5. The green sheet nipping unit 7 comprises a nip roll 16 which freely rotates and a drive pneumatic cylinder 17. The nipping of the green sheet nipping unit 7 is carried out by moving the nip roll by the drive pneumatic cylinder 17, nipping the green sheet 1 between the nip roll 16 and the polygonal columnar roll 5 and closely bonding the green sheet 1 to the polygonal columnar roll 5. After the green sheet 1 is bonded by the sheet fixing unit 8, the nip roll 16 is moved away from the green sheet 1.

The nip roll 16 of the green sheet nipping unit 7 may be moved away from the polygonal columnar roll 5 immediately after bonding by the sheet fixing unit 8 is completed or after the internal conductive layer is formed by the pattern forming unit 9.

The sheet fixing unit 8 is arranged right after the green sheet nipping unit 7. The sheet fixing unit 8 of this embodiment comprises a fixing unit 18 using a heater and a fixing unit drive 19 composed of a pneumatic cylinder. The shape of the heater is cylindrical. After the green sheet 1 is nipped by the green sheet nipping unit 7, the fixing unit 18 is moved close to the polygonal columnar roll 1 by the fixing unit drive 19 and the heater of the fixing unit 18 is moved in the width direction and the longitudinal direction of the green sheet 1 while the end of the heater which was heated to a temperature in the neighborhood of the softening point of an organic binder, is pressed against the green sheet 1 to thermally fuse together the layers of the wound green sheet 1. After bonding, the fixing unit 18 is moved away from the green sheet 1 and bonding is completed.

After the bonding of the sheet, the pattern forming unit 9 forms an internal conductive layer on the green sheet 1. The pattern forming unit 9 is installed above the flat portion on the peripheral surface of the polygonal columnar roll 5. The pattern forming unit 9 of this embodiment comprises a rolled transfer film 20, a feed unit 21 having a feed shaft, guide rollers 22, 22' for carrying the transfer film, a take-up unit 23 for taking up the base film of the transfer film, a transfer head 24, a transfer head drive 25, a tension detector 26 for the transfer film, a tension controller 27 for the transfer film and a positioning unit 28 for detecting the position of the transfer film. The transfer film 20 is supplied from the feed shaft of the feed unit 21, carried such that it is arranged parallel to the flat portion on the peripheral surface of the polygonal columnar roll 5 by the guide rollers 22, 22' and taken up by the take-up unit 23 after transfer. The tension of the transfer film 20 when it is carried is controlled to a certain level by the tension detector 26 and the tension controller 27 for the transfer film. The transfer head 24 is installed between the guide rollers 22, 22' arranged parallel to the flat portion on the peripheral surface of the polygonal columnar roll 5. Transfer is carried out as follows. The whole pattern forming unit 9 first moves down and approaches the flat portion on the peripheral surface of the polygonal columnar roll 5. Thereafter, only the transfer head 24 moves down further and transfers an internal conductive layer on the green sheet 1. Stated more specifically, the transfer head 24 is moved vertically by the hydraulic cylinder of the transfer head drive 25 to transfer the internal conductive layer having a predetermined pattern formed on the transfer film 20 on the green sheet 1 while it is in contact with the polygonal columnar roll 5. The transfer of the internal conductive layer is carried out by contacting and pressing the transfer head 24 heated by the heater to the transfer film 20. After transfer, the whole pattern forming unit 9 moves up and departs from the polygonal columnar roll 5. A predetermined length of the transfer film 20 is supplied by the feed unit 21, the take-up unit 23 and the positioning unit 28 for the next transfer. The positioning protrusions 14 of the pattern positioning unit 6 moves in a direction that it departs from the polygonal columnar roll 5 to complete positioning.

After the formation of the internal conductive layer, the polygonal columnar roll 5 rotates until the next flat portion on the peripheral surface of the polygonal columnar roll 5 comes into position.

The above operation is repeated until a laminate consisting of a desired number of layers for a laminate ceramic capacitor is obtained.

Figure 2:
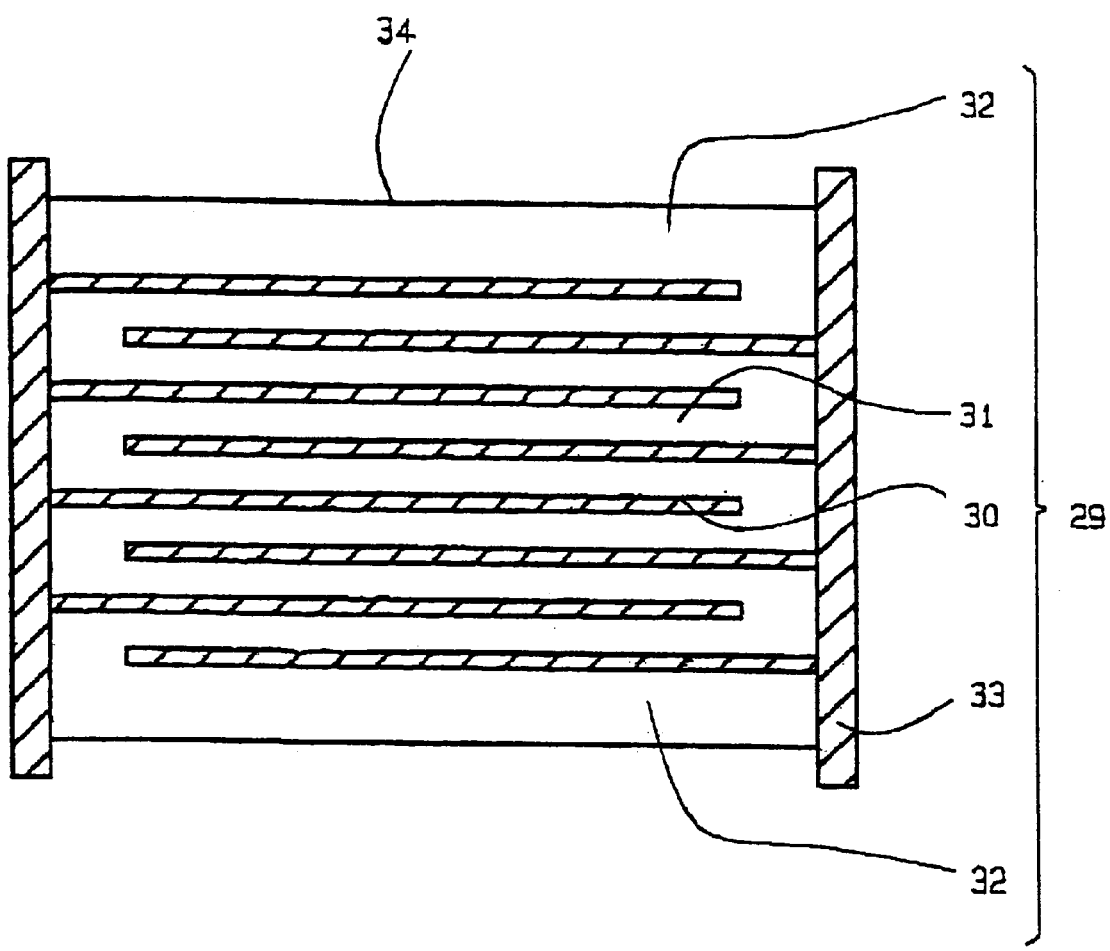
FIG. 2 is a sectional view of an example of a laminate ceramic capacitor produced by the present invention.

Before and after the formation of the above laminate having the internal conductive layer formed thereon, the polygonal columnar roll 5 is rotated intermittently to carry out steps other than the formation of the internal conductive layer so as to obtain a cover layer 32 for a laminate ceramic capacitor 29 shown in FIG. 2. This operation is carried out until the cover layer 32 having a desired number of layers is obtained.

Thus, a laminate 34 for laminate ceramic capacitors is formed with the size of the flat portions on the peripheral surface of the polygonal columnar roll 5.

According to the present invention, the steps of forming the internal conductive layer on the columnar roll and forming the laminate can be carried out with a series of operations. Therefore, transport work between steps which is required when these steps are not carried out with a series of operations is not necessary and a process which does not include a drying step can be employed by a transfer system for forming a conductive layer, thereby making it possible to reduce the time required to obtain a laminate and to produce a laminate efficiently.

When the laminate is used to produce ceramic capacitors, a laminate obtained by using the green sheet which shrinks by heating in a stretching direction shrinks in the center direction of the roll of the laminate by heat-treatment which will be carried out thereafter. Therefore, the laminate can be made extremely dense in structure and used to produce small-sized, large-capacity capacitors.

Figure 3:
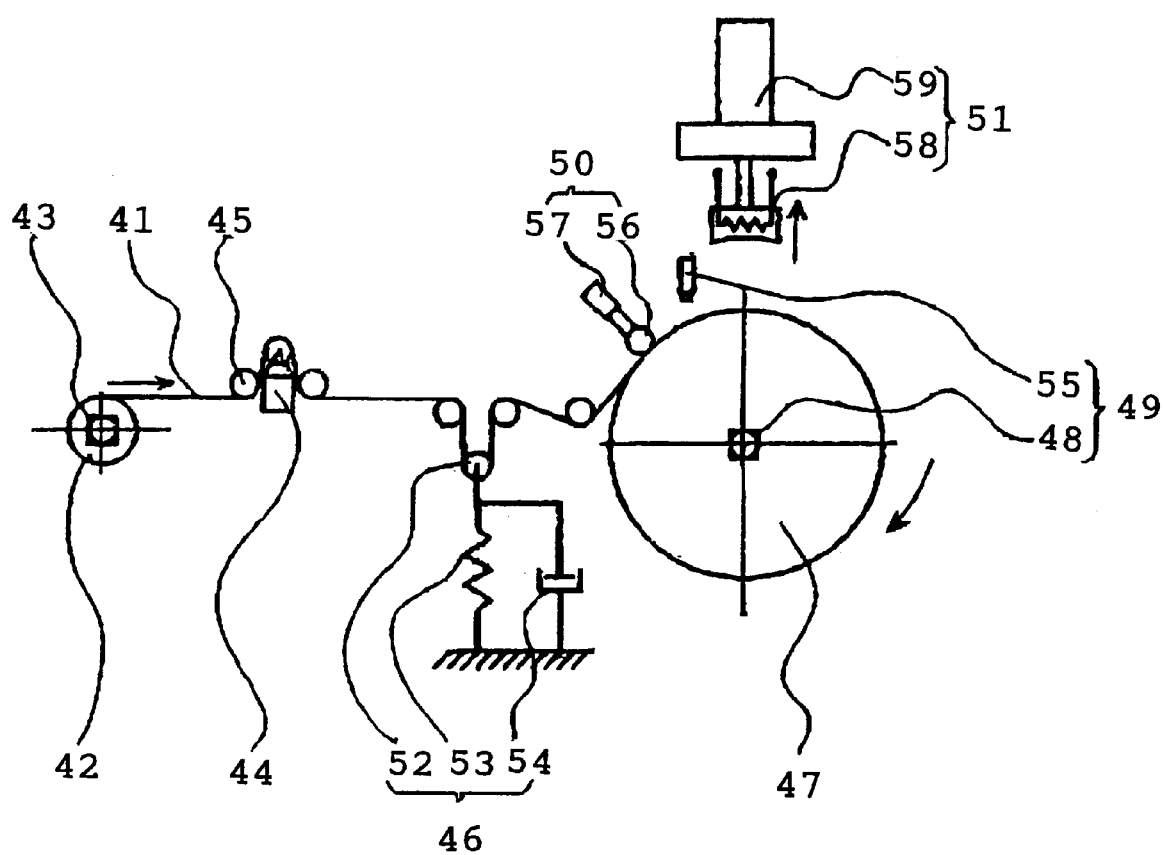
FIG. 3 is a diagram for explaining the whole constitution of a production apparatus according to another embodiment of the present invention than FIG. 1.

FIG. 3 is a diagram showing the basic configuration of an apparatus for producing a laminate for laminate ceramic capacitors according to an embodiment of the present invention. The apparatus of FIG. 3 is used to produce a laminate using a green sheet having a predetermined pattern formed thereon. In FIG. 3, the apparatus comprises a feed shaft 42 for unrolling a green sheet 41, a feed shaft drive motor 43 for driving the feed shaft and controlling the tension of the green sheet 41 based on the tension detected by a tension detector 44, the tension detector 44 for detecting a change in tension during the traveling of the green sheet 41, sheet guide rollers 45 for guiding the green sheet 41 from the feed shaft 42 to a columnar roll 47, a tension control unit 46 composed of a dancer roll for controlling a change in tension at the time of accelerating or decelerating the rotation of the columnar roll 47, the columnar roll 47 for taking up the green sheet 41 to form a laminate, and a columnar roll drive motor 48 for rotating the columnar roll 47 in a predetermined direction and positioning a predetermined pattern formed on the green sheet 41 to be laminated on the green sheet 41 wound round the columnar roll 47 with respect to a predetermined pattern formed on the green sheet 41 wound round the columnar roll 47. Reference numeral 49 denotes a pattern positioning unit for positioning the predetermined pattern formed on the green sheet 41 to be laminated on the green sheet 41 wound round the columnar roll 47 with respect to the predetermined pattern formed on the green sheet 41 wound round the columnar roll 47, 50 a green sheet nipping unit for closely bonding the layers of the wound green sheet 41, and 51 a sheet bonding unit for fixing the layers of the green sheet 41 by adhesion so that they do not shift out of alignment from one another.

The rolled green sheet 41 having a predetermined pattern formed thereon is unrolled by the feed shaft 42 and the feed shaft drive motor 43. The tension detector 44 is composed of a tension detection sensor for detecting the deflection of a flat spring based on the tension of the green sheet 41 with a differential transformer. A tension control system is provided to control the tension of the green sheet 41 by detecting a change in tension by means of the tension detector 44 and by controlling the torque of the feed shaft drive motor 43. Further, the tension controller 46 of a dancer roll system comprising a dancer roll 52, a spring 53 and a damper 54 is provided to control a change in tension at the time of accelerating or decelerating the rotation of the columnar roll 47.

The green sheet 41 unrolled from the feed shaft 42 is carried by the sheet guide rollers 45 to be taken up by the columnar roll 47.

The pattern positioning unit 49 comprises an image detection camera 55, an image processing controller (not shown) and a columnar roll drive motor 48 for rotating the columnar roll 47 to position the predetermined pattern formed on the green sheet 41.

A description is subsequently given of pattern positioning. The columnar roll 47 is rotated by the columnar roll drive motor 48 until the predetermined pattern consisting of quadrilaterals arranged in a longitudinal direction of the green sheet 41 at predetermined intervals and a detection mark come to the detection position of the image detection camera 55. When the detection mark is detected by the image detection camera 55 and the image processing controller, the columnar roll drive motor 48 stops operation to stop the columnar roll 47. When the detection mark is off a predetermined position, the columnar roll 47 is rotated in an either direction by the columnar roll drive motor 48 to stretch or loosen the green sheet 41 so as to position the predetermined pattern formed on the green sheet 41.

After the positioning of the predetermined pattern formed on the green sheet 41, layers of the already wound green sheet 41 are closely bonded together by the green sheet nipping unit 50 and fixed by close-bonding by the sheet bonding unit 51 so that they do not shift out of alignment from one another.

The green sheet nipping unit 50 is installed at a position where the green sheet 41 begins to be wound round the columnar roll 47. The green sheet nipping unit 50 comprises a nip roll 56 which freely rotates and a pneumatic drive cylinder 57. The nipping of the green sheet nipping unit 50 is carried out by moving the nip roll 56 by the pneumatic drive cylinder 57, sandwiching the green sheet 41 between the nip roll 56 and the columnar roll 46, and contacting the green sheet 41 to the columnar roll 47. After the green sheet 41 is bonded by the sheet bonding unit 51, the nip roll 56 moves away from the green sheet 41.

The sheet bonding unit 51 is installed right after the green sheet nipping unit 50, The sheet bonding unit 51 of this embodiment comprises a bonding unit 58 using a heater and a bonding unit drive 59 composed of a pneumatic cylinder. The heater is shaped like a plate and arranged to cover the four sides in longitudinal and transverse directions of the predetermined pattern formed on the green sheet 41. After the green sheet 41 is nipped by the green sheet nipping unit 50, the bonding unit 58 moves toward the columnar roll 47 by the bonding unit drive 59, and the end of the heater is pressed against the green sheet 41 to thermally fuse together the layers of the wound green sheet 41. After bonding, the bonding unit 56 moves away from the green sheet 41 and bonding is completed.

After the bonding of the green sheet 41, to position the predetermined pattern formed on the green sheet 41, the columnar roll 47 is rotated until the detection mark is detected by the image detection camera.

The above operation is repeated until a laminate for laminate ceramic capacitors having a desired number of layers is repeated.

Before and after the formation of a laminate having an internal electrode formed thereon, to obtain a cover layer 32 for the laminate ceramic capacitor 29 shown in FIG. 2, the columnar roll 47 is rotated and all the steps excluding the step of positioning the internal electrode are carried out. This operation is carried out until a desired number of cover layers 32 is obtained.

Thus, a laminate 34 for laminate ceramic capacitors is formed with the size of an area on the peripheral surface of the columnar roll 47.

The following examples are given to further illustrate the present invention.

EXAMPLE 1

A 12 cm-wide, 15 $\mu$m-thick green sheet comprising 91 wt % of a ceramic essentially composed of barium titanate and 9 wt % of ultra high molecular weight polyethylene and having a porosity of 50%, a weight per unit area of 40 g/m$^2$ and a shrinkage factor at 155° C. of 45% was used. This green sheet was wound round a hexagonal roll 20 times to form cover layers. At this point, in winding of each cycle, four ends of the green sheet on each face of the hexagonal roll were thermally fixed at 140° C. to bond together the layers of the green sheet and pressed with a pressure of 50 kg/cm$^2$ at 120° C. for 5 seconds.

Thereafter, a pattern for forming an electrode layer was formed on a 20-th layer of the green sheet which was the uppermost layer of the cover layers, by a screen printing. Silver/palladium (weight ratio of 70/30) was used as metal powders, ethyl cellulose as a binder resin and a mixed solvent of a hydrocarbon-based solvent and a high-boiling alcohol as a solvent were used for this printing. The pattern consisted of 6.92 mm×1.3 mm quadrilaterals which were arranged in 8 rows in a longitudinal direction and 30 rows in a transverse direction at intervals of 0.6 mm. The pattern was dried at 60° C. for 3 minutes after printing. Thereafter, a 21-th layer of the green sheet was wound round on a 20-th layer of the green sheet, and four ends of the green sheet were thermally fixed at 140° C. to bond together the 20-th layer and 21-th layer of the green sheet similarly to the formation of the above cover layers. Then, these layers were pressed at a pressure of 50 kg/cm$^2$ at 120° C. for 5 seconds. A pattern was then formed on the 21-th layer of the green sheet by the above screen printing in such a manner that it was spaced apart from the pattern formed on the 20-th layer of the green sheet by 3.76 mm in the longitudinal direction. A 22-th layer of the green sheet was wound round the 21-th layer of the green sheet, thermally fixed and press-bonded to the 21-th layer in the same manner as described above. The winding, thermal fixing and press-bonding of the green sheet and the formation of a pattern were repeated until the number of pattern layers became 51. Thereafter, 20 cover layers were again laminated on the pattern layers, and the tail end of the green sheet was thermally fixed at 140° C. to produce a laminate.

The obtained laminate was then subjected to a relaxation under heat-treatment at 155° C. for 4 minutes. At this point, a collected sample had a shrinkage factor at 200° C. of less than 0.3. Thereafter, a heat resistant bag was used to contain the laminate in vacuum, placed in a hydrostatic press filled with triethylene glycol at 155° C. and pressurized at 1,000 kg/cm$^2$ at 150° C. for 4 minutes, and then the sample was taken out and formed into chips according to the pattern. The obtained chips were baked in the atmosphere gradually by elevating the temperature to 1,140° C. and maintaining that temperature for 2 hours.

An external electrode was formed on the obtained baked product using a silver conductive paste and baked. The thus obtained laminate ceramic capacitor had a capacitance at 1 kHz of 203 nF and a dielectric loss factor of 2.4%.

EXAMPLE 2

An electrode pattern was formed on a 12 cm-wide, 14 $\mu$m-thick green sheet comprising 91 wt % of a ceramic essentially composed of barium titanate and 9 wt % of ultra high molecular weight polyethylene and having a porosity of 20%. The pattern consisting of 6.92 mm×1.3 mm quadrilaterals was formed on the green sheet using a silver/palladium conductive paste (70/30) by a screen printing. The long axis of the pattern was parallel to a longitudinal direction of the green sheet, and the quadrilaterals of the pattern were arranged in 30 rows in a transverse direction of the green sheet at intervals of 0.6 mm.

Two of the green sheet (G1, G2) were wound round a cylindrical bobbin having a circumference of 1,196 mm together in such a manner that the green sheet G2 was placed upon the green sheet G1. After portions having no pattern printed thereon of the two green sheets were first wound round the cylindrical bobbin seven times, portions having a pattern printed thereon of the two green sheets were wound in such a manner that a pattern formed on the green sheet G2 overlapped with a pattern on the green sheet G1 and covered the interval between the adjacent quadrilaterals of the pattern on the green sheet G1 and the pattern on the green sheet G1 covered the interval of the adjacent quadrilaterals of the pattern on the green sheet G2. In other words, the patterns formed on the green sheets G1 and G2 were spaced apart from each other by half the length of the quadrilateral. Thus, the green sheet used to form the pattern on the most inner side to the bobbin was wound 11 times and the other green sheet was wound 10 times to form 20 cover layers. Thereafter, the green sheets having no pattern printed thereon were wound 7 times.

The ends of the green sheets were fixed by a heat resistant tape and this roll was maintained at 155° C. by a hot air drier for 30 minutes. This roll was cut perpendicularly to the circumferential direction of the bobbin to give a laminate sheet, and the obtained laminate sheet was formed into chips. The obtained chips were baked gradually in the atmosphere by elevating the temperature to 1,140° C. and maintaining that temperature for 2 hours.

An external electrode was formed on the obtained baked product using a silver conductive paste and baked. The thus obtained laminate ceramic capacitor had a capacitance at 1 kHz of 110 nF and a dielectric loss factor of 1.9%.

EXAMPLE 3

An electrode rectangular pattern was formed on a 12 cm-wide, 20 $\mu$m-thick green sheet comprising 91 wt % of a ceramic essentially composed of barium titanate and 9 wt % of ultra high molecular weight polyethylene and having a porosity of 10%. The pattern consisting of 6.92 mm×1.3 mm quadrilaterals was formed on the green sheet by a screen printing using a silver/palladium conductive paste (70/30). The long axis of the pattern was parallel to the edge of the green sheet, and the quadrilaterals of the pattern were arranged in 30 rows in a transverse direction at intervals of 0.6 mm.

The green sheet was wound round a cylindrical bobbin having a circumference of 1,200 mm. A portion having no pattern printed thereon of the green sheet was first wound round the cylindrical bobbin 15 times and then another portion having a pattern printed thereon of the green sheet was wound in such a manner that the pattern of a first layer was spaced apart from the pattern of a second layer by half the length of the quadrilateral. That is, the green sheet was wound to ensure that a central portion between 160-th and 161-th quadrilaterals should be located at a central portion of a first quadrilateral by first winding and a central portion between 319-th and 320-th quadrilaterals should be located at a central portion of a 160-th quadrilateral by second winding (in this case, the first quadrilateral and the 320-th quadrilateral overlapped with each other). The green sheet was wound 21 times in the same manner. A portion having no pattern printed thereon of the green sheet was wound 15 times again. Thereafter, the end of the green sheet was fixed by a heat resistant tape and this roll was maintained at 155° C. with a hot air drier for 30 minutes. The roll was then cut perpendicularly to the circumferential direction of the bobbin to produce a laminate and the obtained laminate was formed into chips. The obtained chips were baked gradually in the atmosphere by elevating the temperature at 1,140° C. and maintaining that temperature for 2 hours.

An external electrode was formed on the obtained baked product using a silver conductive paste and baked. Thus obtained laminate ceramic capacitor had a capacitance at 1 kHz of 104 nF and a dielectric loss factor of 1.9%.

What is claimed is:

1. An apparatus for producing a laminate for electronic parts comprising:

(1) a feed unit for unrolling a self-supporting green sheet which contains inorganic powder and an organic binder;

(2) a columnar roll for taking up and laminating the self-supporting green sheet;

(3) a fixing unit for fixing the layers of the green sheet taken up by the columnar roll so that they do not shift out of alignment from one another;

(4) a pattern forming unit for forming an internal conductive layer having a predetermined pattern on the green sheet taken up by the columnar roll; and (5) a pattern positioning unit for positioning the same pattern on the green sheet G2 of the next cycle to be laminated adjacently onto the green sheet G1 as a predetermined pattern on the green sheet G1 of the previous cycle taken up by the columnar roll with respect to the predetermined pattern on the green sheet G1.

2. The apparatus of claim 1, wherein the organic binder of the feed unit (1) is ultra high molecular weight polyethylene.

3. The apparatus of claim 1, wherein the green sheet of the feed unit (1) is a uniaxially or a biaxially oriented sheet having a porosity of 1 to 80% by volume.

4. The apparatus of claim 1, wherein the columnar roll (2) is a column having a smooth and curved peripheral surface, a polygonal column or a plate.

5. The apparatus of claim 1, wherein the fixing unit (3) fixes the laminated layers of the green sheet by heat.

6. The apparatus of claim 1, wherein the pattern forming unit (4) forms a predetermined pattern on the green sheet taken up by the columnar roll by transfer.

7. The apparatus of claim 1, wherein the predetermined pattern formed on the green sheet G1 of the previous cycle taken up by the columnar roll consists of a plurality of quadrilaterals arranged linearly at intervals, each of which is shorter than the length of one side parallel to the arrangement direction of the quadrilateral, and the quadrilaterals of the same shape are arranged on the green sheet G2 of the next cycle to be laminated adjacently onto the green sheet G1 in the same configuration in such a manner that they are shifted from the quadrilaterals of the green sheet G1 to cover the interval between the adjacent quadrilaterals of the pattern on the green sheet G1.

8. The apparatus of claim 7, wherein the predetermined pattern consists of a plurality of rows of quadrilaterals arranged linearly.

9. An apparatus for producing a laminate for electronic parts comprising:

(1) a feed unit for unrolling a self-supporting green sheet which contains inorganic powder and an organic binder;

(2) a columnar roll for taking up and laminating the self-supporting green-sheet;

(3) a fixing unit for fixing the layers of the green sheet taken up by the columnar roll so that they do not shift out of alignment from one another; and (4) a pattern positioning unit for positioning the same pattern on the green sheet G2 of the next cycle to be laminated adjacently onto the green sheet G1 as a predetermined pattern on the green sheet G1 of the previous cycle taken up by the columnar roll with respect to the predetermined pattern on the green sheet G1.

10. The apparatus of claim 9, wherein the organic binder of the feed unit (1) is ultra high molecular weight polyethylene.

11. The apparatus of claim 9, wherein the green sheet of the feed unit (1) is a uniaxially or a biaxially oriented sheet having a porosity of 1 to 80% by volume.

12. The apparatus of claim 9, wherein the columnar roll (2) is a column having a smooth and curved peripheral surface, a polygonal column or a plate.

13. The apparatus of claim 9, wherein the fixing unit (3) fixes the laminated layers of the green sheet by heat.

14. The apparatus of claim 9, wherein the predetermined pattern formed on the green sheet G1 of the previous cycle taken up by the columnar roll consists of a plurality of quadrilaterals arranged linearly at intervals, each of which is shorter than the length of one side parallel to the arrangement direction of the quadrilateral, and the quadrilaterals of the same shape are arranged on the green sheet G2 of the next cycle to be laminated adjacently onto the green sheet G1 in the same configuration in such a manner that they are shifted from the quadrilaterals of the green sheet G1 to cover the interval between the adjacent quadrilaterals of the pattern on the green sheet G1.

15. The apparatus of claim 14, wherein the predetermined pattern consists of a plurality of rows of quadrilaterals arranged linearly.

16. The apparatus of claim 9 which further comprises a press-bonding unit for close-bonding the layers of the green sheet taken up by the columnar roll.

17. An apparatus for producing a laminate for ceramic capacitors comprising:

(1) a feed unit for unrolling a self-supporting green sheet which contains inorganic powder and an organic binder;

(2) a columnar roll for taking up and laminating the self-supporting green sheet;

(3) a fixing unit for fixing the layers of the green sheet taken up by the columnar roll so that they do not shift out of alignment from one another;

(4) a press-bonding unit for closely bonding together the layers of the green sheet taken up by the columnar roll;

(5) a pattern forming unit for forming an internal conductive layer having a predetermined pattern on the green sheet taken up by the columnar roll; and (6) a pattern positioning unit for positioning the same pattern on the green sheet G2 of the next cycle to be laminated adjacently onto the green sheet G1 as a predetermined pattern on the green sheet G1 of the previous cycle taken up by the columnar roll with respect to the predetermined pattern on the green sheet G1.

18. A process for producing a laminate for electronic parts by winding a self-supporting green sheet which contains inorganic powder and an organic binder and has a predetermined pattern for forming an internal conductive layer formed thereon round a columnar roll several times to form a laminate, wherein the green sheet G2 of the next cycle is wound round the green sheet G1 of the previous cycle to ensure that a fixed positional relationship is established between a predetermined pattern formed on the green sheet G1 wound round the columnar roll and the same pattern formed on the green sheet G2 of the next cycle, as the predetermined pattern on the green sheet G1;

cutting the obtained laminate into chips according to the pattern;

heating the chips to remove the organic binder; and baking the so-heated chips.

19. The process of claim 18 which further comprises the step of fixing the green sheets G1 and G2 by heat to assist the establishment of the fixed positional relationship between the predetermined patterns formed on the green sheets G1 and G2 wound adjacent to each other.

20. The process of claim 18, wherein the predetermined pattern formed on the green sheet G1 of the previous cycle wound round the columnar roll consists of a single row or a plurality of rows of quadrilaterals arranged linearly at intervals, each of which is shorter than the length of one side parallel to the arrangement direction of the quadrilateral, and the green sheet G2 is wound round the green sheet G1 by locating each of the quadrilaterals of the green sheet G2 of the next cycle to cover the interval between the adjacent quadrilaterals of the green sheet G1 to establish the fixed positional relationship between the predetermined patterns of the adjacent green sheets G1 and G2.

21. The process of claim 18, wherein a self-supporting green sheet having a predetermined pattern for forming an internal conductive layer formed thereon is used.

22. The process of claim 18, wherein the predetermined pattern for forming an internal conductive layer is formed on the self-supporting green sheet G1 of the previous cycle having no predetermined pattern for forming an internal conductive layer before the self-supporting green sheet G2 of the next cycle is wound round the self-supporting green sheet G1.

23. The process of claim 18, wherein the organic binder is ultra high molecular weight polyethylene.

24. The process of claim 18, wherein the green sheet is a uniaxially or a biaxially oriented sheet having a porosity of 1 to 80% by volume.

25. The process of claim 18, wherein the columnar roll is a column having a smooth and curved peripheral surface, a polygonal column or a plate.

26. The process of claim 18, wherein the predetermined pattern for forming an internal conductive layer is formed on the self-supporting green sheet wound round the columnar roll and having no internal conductive layer by transfer.

27. The process of claim 18 which further comprises the step of thermally relaxing the laminate wound round the columnar roll to control shrinkage in the lamination plane at 200° C. to 1% or less.

28. The process of claim 18 or 27 which further comprises the step of hydrostatically pressing the laminate wound round the columnar roll.

29. A process for producing a laminate for electronic parts by
  winding a self-supporting green sheet which contains inorganic powder and an organic binder and has a predetermined pattern for forming an internal conductive layer formed thereon round a columnar roll several times to form a laminate, wherein either one or both of the following steps is/are carried out in the order named after the step of winding the green sheet G2 of the next cycle round the green sheet G1 of the previous cycle to ensure that a fixed positional relationship is established between a predetermined pattern formed on the green sheet G1 wound round the columnar roll and the same pattern formed on the green sheet G2 of the next cycle as the predetermined pattern on the green sheet G1;
  the step of thermally relaxing the obtained laminate wound round the columnar roll to control shrinkage in the lamination plane at 200° C. to 1% or less; and
  the step of hydrostatically pressing the laminate wound round the columnar roll;
  cutting the obtained laminate into chips according to the pattern;
  heating the chips to remove the organic binder; and
  baking the so-heated chips.

30. A process for producing a ceramic capacitor using a laminate formed by
  winding a self-supporting green sheet containing ceramics powder and ultra high molecular weight polyethylene round a columnar roll several times to form a laminate, wherein the green sheet G2 of the next cycle is wound round the green sheet G1 of the previous cycle to ensure that a fixed positional relationship is established between a predetermined pattern formed on the green sheet G1 wound round the columnar roll and the same pattern formed on the green sheet G2 of the next cycle, as the predetermined pattern on the green sheet G1; the predetermined pattern is formed on the green sheet G1 before the self-supporting green sheet G2 of the next cycle is wound round the self-supporting green sheet G1 having no predetermined pattern for forming an internal conductive layer; the predetermined pattern consists of a single row or a plurality of rows of quadrilaterals arranged linearly at intervals, each of which is shorter than the length of one side parallel to the arrangement direction of the quadrilateral; and the green sheet G2 is wound round the green sheet G1 by locating each of the quadrilaterals of the green sheet G2 of the next cycle to cover the interval between the adjacent quadrilaterals of the green sheet G1 to establish the above fixed positional relationship between the predetermined patterns of the adjacent green sheets G1 and G2;
  cutting the obtained laminate into chips according to the pattern;
  heating the chips to remove the organic binder; and
  baking the so-heated chips.

31. The process of claim 30 which further comprises the step of fixing the green sheets G1 and G2 by heat to assist the establishment of the fixed positional relationship between the predetermined patterns formed on the green sheets G1 and G2.

32. The process of claim 30 which further comprises the step of applying pressure to the green sheets G1 and G2 in a lamination direction to closely bond together the green sheets G1 and G2 wound adjacent to each other before the predetermined pattern is formed on the green sheet G2.

33. The process of claim 30 which further comprises the step of thermally relaxing the laminate wound round the columnar roll to control shrinkage in the lamination plane at 200° C. to 1% or less.

34. The process of claim 30 or 33 which further comprises the step of hydrostatically pressing the laminate wound round the columnar roll.

35. A process for producing electronic parts, which comprises winding a self-supporting green sheet which contains inorganic powder and an organic binder and has a predetermined pattern for forming an internal conductive layer formed thereon round a columnar roll several times to form a laminate, wherein
  the green sheet G2 of the next cycle is wound round the green sheet G1 of the previous cycle to ensure that a fixed positional relationship is established between a predetermined pattern formed on the green sheet G1 wound round the columnar roll and the same pattern formed on the green sheet G2 of the next cycle, as the predetermined pattern on the green sheet G1;
  cutting the obtained laminate into chips according to the pattern;
  heating the chips to remove the organic binder;

baking the so-heated chips; and forming external electrodes on the so-obtained chips to form electronic parts.

36. A process for producing electronic parts using a laminate formed by winding a self-supporting green sheet which contains inorganic powder and an organic binder and has a predetermined pattern for forming an internal conductive layer formed thereon round a columnar roll several times, wherein either one or both of the following steps is/are carried out in the order named after the step of winding the green sheet G2 of the next cycle round the green sheet G1 of the previous cycle to ensure that a fixed positional relationship is established between a predetermined pattern formed on the green sheet G1 wound round the columnar roll and the same pattern formed on the green sheet G2 of the next cycle as the predetermined pattern on the green sheet G1;

the step of thermally relaxing the obtained laminate wound round the columnar roll to control shrinkage in the lamination plane at 200° C. to 1% or less; and the step of hydrostatically pressing the laminate wound round the columnar roll;

cutting the obtained laminate into chips according to the pattern;

heating the chips to remove the organic binder;

baking the so-heated chips; and forming external electrodes on the so-obtained chips to form electronic parts.

37. A process for producing a ceramic capacitor using a laminate formed by winding a self-supporting green sheet containing ceramics powder and ultra high molecular weight polyethylene round a columnar roll several times, wherein the green sheet G2 of the next cycle is wound round the green sheet G1 of the previous cycle to ensure that a fixed positional relationship is established between a predetermined pattern formed on the green sheet G1 wound round the columnar roll and the same pattern formed on the green sheet G2 of the next cycle, as the predetermined pattern on the green sheet G1; the predetermined pattern is formed on the green sheet G1 before the self-supporting green sheet G2 of the next cycle is wound round the self-supporting green sheet G1 having no predetermined pattern for forming an internal conductive layer; the predetermined pattern consists of a single row or a plurality of rows of quadrilaterals arranged linearly at intervals, each of which is shorter than the length of one side parallel to the arrangement direction of the quadrilateral; and the green sheet G2 is wound round the green sheet G1 by locating each of the quadrilaterals of the green sheet G2 of the next cycle to cover the interval between the adjacent quadrilaterals of the green sheet G1 to establish the above fixed positional relationship between the predetermined patterns of the adjacent green sheets G1 and G2;

cutting the obtained laminate into chips according to the pattern;

heating the chips to remove the organic binder; baking the so-heated chips; and forming external electrodes on the so-obtained chips to form electronic parts.

* * * * *